United States Patent [19]

Kobayashi

[11] Patent Number: 4,485,461

[45] Date of Patent: Nov. 27, 1984

[54] MEMORY CIRCUIT

[75] Inventor: Satoru Kobayashi, Tokyo, Japan

[73] Assignee: Nippon Electric Co., Ltd., Tokyo, Japan

[21] Appl. No.: 367,523

[22] Filed: Apr. 12, 1982

[51] Int. Cl.³ .............................................. G11C 11/40
[52] U.S. Cl. ................................... 365/239; 365/193
[58] Field of Search ............... 365/189, 190, 193, 194, 365/239, 240, 233

[56] References Cited

U.S. PATENT DOCUMENTS

3,846,769 11/1974 Shepherd ........................... 365/239
4,164,031 8/1979 Low et al. ...................... 365/193 X Primary Examiner—Joseph A. Popek
Attorney, Agent, or Firm—Sughrue, Mion, Zinn, Macpeak & Seas

[57] ABSTRACT

A memory circuit which can perform consecutive write operations at a high speed is disclosed. The memory circuit comprises a plurality of bus lines, a plurality of memory cell groups associated with the respective bus lines, a plurality of latch circuits coupled to the respective bus lines, and means for sequentially supplying the bus lines with write data, in which the write data are stored in the latch circuits and transferred to selected memory cells of the respective memory cell groups.

11 Claims, 5 Drawing Figures

|  | READ | WRITE |
|---|---|---|
| TC1 RAS/CAS CYCLE | 270 ns | 270 ns |
| TC2 CONSECUTIVE ACCESS CYCLE | 70 ns | 70 ns |
| TC3 CONSECUTIVE ACCESS TERMINATION CYCLE | 70 ns | 90 ns |

MEMORY CIRCUIT

BACKGROUND OF THE INVENTION

The present invention relates to a memory circuit, and more particularly a semiconductor memory circuit employing MOS transistors.

In semiconductor memory is making use of MOS transistors, the memory capacity has been steadily increasing owing to the progress of the integration technique in the recent years and memory devices having 64 K bit capacity have been made commerciably available. While, owing to the progress of the circuit technique, the number of pins in a package has been decreased and the integration density of memory devices has been increased by a multiple-addressing technique this technique is detailed in U.S. Pat. No. 3,969,706 in which row address signals and column address signals are incorporated through the same set of address terminals in response to a row address strobe signal ($\overline{RAS}$) and a column address strobe signal ($\overline{CAS}$), respectively. However, according to the multiple-addressing technique, each operation of the memory requires the activation of the row address strobe signal and the activation of the column strobe signal in sequence, and hence the operation speed of this type memory has been limited. In this respect, the inventor of the present invention has already proposed a novel memory in Japanese patent application No. 100850/1980 which has now issued as U.S. Pat. No. 4,429,375. According to this prior application, the memory circuit is a MOS random access memory (hereinafter abbreviated as RAM) formed by providing a plurality of input/output (I/O) bus pairs and a decoder circuit associated with a shift register for enabling the I/O bus pairs to access consecutive addresses along the column direction thereof. The RAM is addressed according to the multiple-addressing system employing a Row Address Strobe clock ($\overline{RAS}$) and Column Address Strobe clock ($\overline{CAS}$), in which initially any arbitrary address information is taken in upon the normal RAS/CAS cycle. When the memory cell has been accessed, column address information is taken in the shift register at the same time. Thereafter, when the operation is transferred to a "consecutive access mode" which is controlled only by the $\overline{CAS}$ clock while maintaining the $\overline{RAS}$ clock at its active level, memory cells having consecutive addresses along the column direction, which addresses are determined on the basis of the column address information taken in during the RAS/CAS cycle just before the transfer to the consecutive access cycle, are accessed bit by bit with each $\overline{CAS}$ clock signals as controlled by a shift clock generated during the consecutive access mode. Therefore, access can be performed without necessitating the column address information which was obtained through a column address buffer in the prior art, so that the operation time necessitated therefor can be omitted.

In connection with the access time in the above-described operation mode, in addition to not necessitating the above-mentioned column address information, the data of the memory cells in the accessed row have already been transmitted to a plurality of I/O bus pairs in amplified states, so that the I/O bus pairs are sequentially selected by an internal clock which is generated immediately at the falling edge of the $\overline{CAS}$ clock. Only a data buffer amplifier associated with the I/O bus pair is activated by a clock generated subsequently in response to the internal clock, and it can transmit cell information to an output terminal. Accordingly, a remarkable effect can be achieved such that high speed access, which has not realized in the page mode in the prior art, can be achieved. As described above, the access time in this consecutive mode is as short as 30 NS or less, the cycle time including the reset time of the $\overline{CAS}$ is also short as 70 NS or less, and thus a memory circuit operable at a high cycle speed can be realized. However, during a write cycle in the consecutive access mode, the operations of taking input information into a data input buffer, producing data binary codes, transferring data to a selected memory cell, etc. must be completed within the activation period of the $\overline{CAS}$, but it is definitely impossible to finish these various operations within the very short period of 30 NS or less. Hence, it is necessary to increase the $\overline{CAS}$ activation period by about 20 NS. This results in a large difference between the read cycle time and the write cycle time, and disadvantages may possibly occur such as a difficulty in the control for the generation of an external drive clock, or a degradation in performance upon introducing the RAM into a system.

SUMMARY OF THE INVENTION

It is one object of the present invention to provide a memory circuit which can perform consecutive write operations at a high speed.

According to one aspect of the present invention, there is provided a memory circuit comprising a plurality of memory cells arranged in a matrix of rows and columns, a first member of bus lines, row means for selecting one of the rows, a first column decoder for selecting a first number of the columns to be connected to the first number of the bus lines, a data line, a plurality of switching means coupled between the data line and the bus lines, a second column decoder for selecting one of the switching means, and a plurality of data registers provided for the respective data lines for operatively storing data on the associated bus line.

According to another aspect of the present invention, there is also provided a memory circuit comprising a plurality of bus lines, a plurality of memory cell groups provided in correspondence to the respective bus lines, a data line, a plurality of transfer gates coupled between the respective bus lines and the data line, means for supplying the data line with write data, a plurality of latch circuits coupled to the respective bus lines, and means for sequentially enabling the transfer gates, in which write data are sequentially stored in the latch circuits through the enabled transfer gates and the stored write data are written into the memory cells associated with the respective bus line.

According to still another aspect of the present invention, there is also provided a memory device comprising a monolithic semiconductor chip; a matrix of memory cells arrayed in rows and columns, a memory cell in each column being connected to a corresponding column line in response to a voltage on a row address line and data being transferred to and from each cell in each column from and to the corresponding column line; sense amplifier means for the respective column lines for discriminating between at least two voltage levels representative of logic states and holding the detected logic state; a row address strobe input for inputting a row address strobe to the chip; row address decode means responsive to a row address strobe input to the chip for decoding row address data and holding the addressed row of memory cells enabled until the termination of the row address cycle; a column address strobe input for inputting a column address strobe signal to the chip; column address means for incorporating column address data in response to said column address strobe signal; column address decoder means; shift register means arranged in parallel with said column address decoder means; control means for operatively enabling said shift register means upon each reception of said column strobe signal during the same row address cycle; a data line, at least one latch circuit for storing data supplied through the data line means responsive to the shift register for enabling the transfer of the stored data to the column identified by the shift register.

DETAILED DESCRIPTION OF THE PREFERRED EMBODIMENTS

Though an explanation will be given by way of an example using N-channel MOS field effect transistors and a positive logic system in which a high level corresponds to a logic "1" level while a low level corresponds to a logic "0" level, it should be apparent that the present invention can be realized by the use of P-channel field effect transistors and/or a negative logic system.

First, with reference to FIGS. 1 and 2, a RAM according to the prior art will be described.

Figure 1:
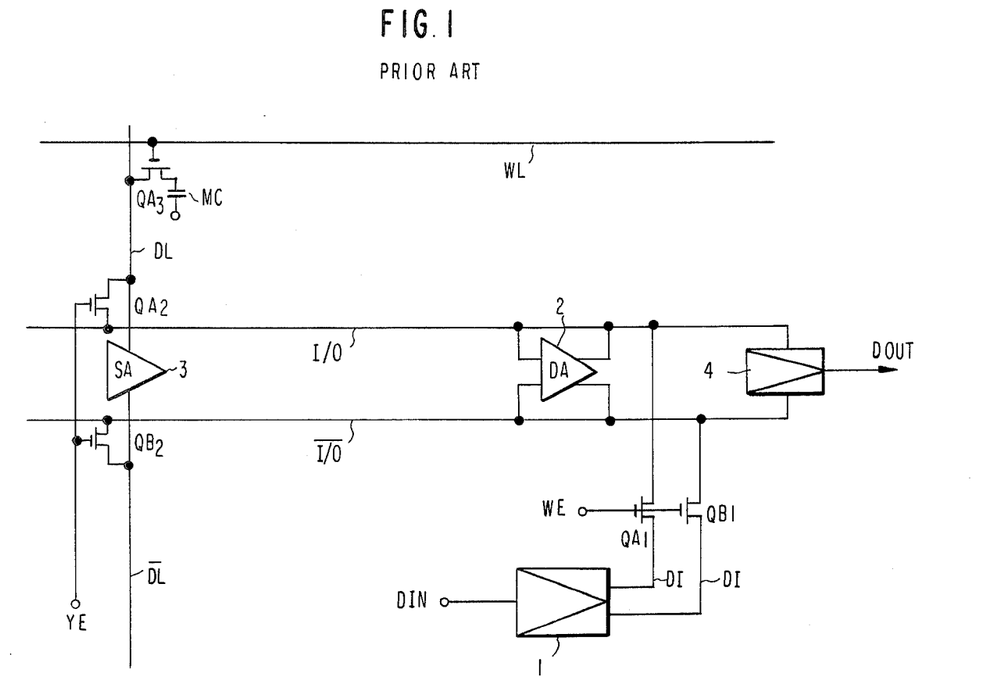
FIG. 1 is a diagram for explaining memory cell read-/write operations in a prior art MOS semiconductor RAM having an I/O bus pair.
Figure 2:
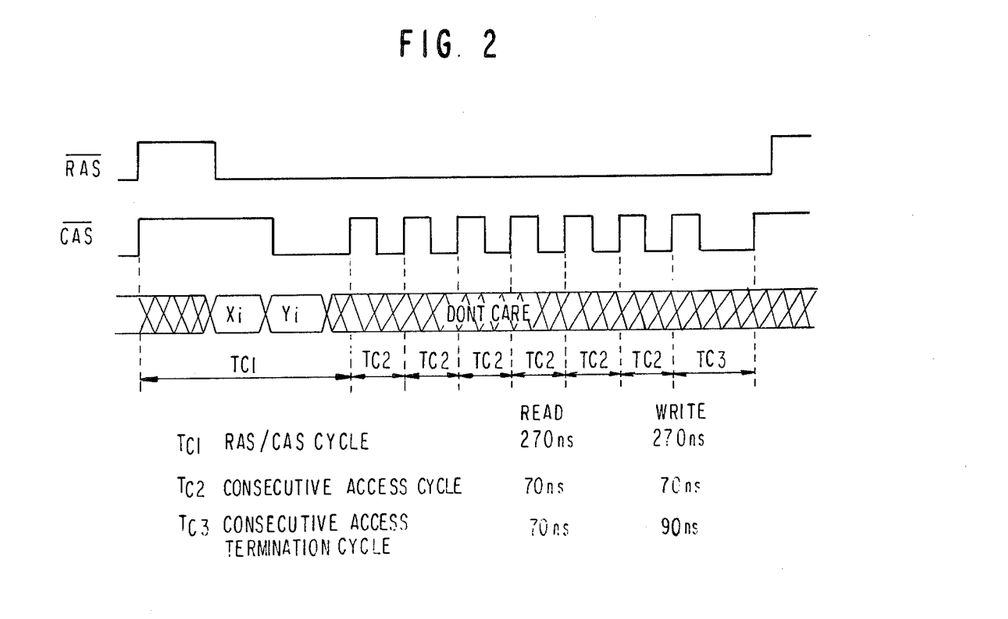
FIG. 2 is a timing waveform diagram showing a consecutive access mode according to the proposed memory of the invention.

The major part employed for a write operation in the conventional RAM are shown in FIG. 1. In FIG. 1, information input during a write cycle is first received by a data input buffer 1 as controlled by a plurality of internal write control signals (not shown) generated in response to the activation of an external write control signal (hereinafter called $\overline{WE}$ clock). Thereafter, it is amplified, transformed into data binary codes and transmitted to an I/O bus pair including bus lines I/O and $\overline{I/O}$ via transfer gate transistors $Q_{A1}$ and $Q_{B1}$, respectively, which are controlled by an internal write control signal WE. The input information transmitted to the I/O bus pair is transmitted to a pair of digit lines DL and $\overline{DL}$ through a pair of transfer gate transistors $Q_{A2}$ and $Q_{B2}$, respectively. These transistors have been already selected by an activated digit line selection signal YE, and act to couple the I/O bus pair in an active state and the digit lines DL and $\overline{DL}$ to each other. Further, the information is transmitted to a memory cell MC via a transfer gate transistor $Q_{A3}$ which is controlled by a selected word line WL.

With regard to the time required until this input information has been written in the memory cell, in the case of the conventional MOS logic "1" level write, especially in the case where the logic "1" level is written after memory cell information at the logic "0" level has been read out (which is believed to be the worst case), if one considers the time necessitated for the write potential to the memory cell to rise from the "0" level to the logic "1" level sufficient for assuming an operating margin of the circuit, a period of 20 nanoseconds (NS)~30 NS would be spent. Hence in the case where this margin is introduced to a RAM operable in a consecutive access mode, the write cycle time in the consecutive access mode would necessitate an excessive write level assumption period of at least 20 NS, and hence, a large difference will be produced between the read cycle time and the write cycle time, resulting in a disadvantage in that in the case of introducing the RAM in a memory system or the like, the performance thereof would be degraded.

Now, the "consecutive access mode" will be explained briefly with reference to timing waveforms in FIG. 2. During a RAS/CAS cycle of a period $T_{C1}$, in response to transistion of the $\overline{RAS}$ clock from the logic "1" level to the logic "0" level, row address information ($X_i$) is input, and the memory cells coupled to the word line designated by the row address information are accessed. Thereafter the $\overline{CAS}$ clock transits from the logic "1" level to the "0" level and thereby column address information ($Y_i$) is input. Subsequently, memory cell information amplified by a sense amplifier designated by the column address information is transmitted to the I/O bus pair, and transmitted to a data output terminal $D_{OUT}$ as controlled by a plurality of internal activation clocks which occur in succession. The row address information is received by a shift register (not shown) as controlled by a holding clock generated in synchronism with the signal for controlling the transfer gate transistors ($Q_{A2}$ and $Q_{B2}$) which couple the memory cell information amplified by the sense amplifier to the I/O bus lines. The shift register has latch and reset functions for the address information in response to a single holding clock, and so long as the RAS/CAS cycles continue, hold and refresh are effected. Thereafter, if the operation transfers to a consecutive access mode ($T_{C2}$) in which only the $\overline{CAS}$ clock changes its level while the $\overline{RAS}$ signal is maintained in an activated state, the feed of the column address information upon every activation of the $\overline{CAS}$ clock as in the case of the page mode in the prior art is not necessitated. On the basis of the column address information taken in the RAS/CAS cycle just prior to the consecutive access mode, the shift register starts transfer of the decoded information for each bit, hence the decoders would be consecutively selected, and thus the time required for the latch operation of the column address information by means of a column address buffer, and that for the operation of the decoders by means of the subsequently amplified and produced address binary codes, can be omitted. Furthermore, in the above-mentioned mode, since the memory information accessed in the RAS/CAS cycle immediately before the initiation of the above-mentioned consecutive access mode has been already amplified and transmitted to a plurality of I/O bus pairs, a selected I/O bus drive signal is produced by the activation clock which is generated immediately as synchronized with the falling edge of the $\overline{CAS}$ signal, and the cell information can be transmitted to an output terminal by merely selecting the I/O bus drive signal, coupling it to a data I/O bus pair and driving the output buffer associated therewith. Accordingly, a remarkable effect can be expected in that an access time of 30 NS or less, which is $\frac{1}{2} \sim \frac{1}{3}$ or less of the access time in the page mode in the prior art, can suffice, and also the time required for the reset of the $\overline{CAS}$ signal in the consecutive access mode may consist of only the precharge time of the data I/O bus and the data buffer, and therefore, a remarkable effect can be realized in shortening the cycle time. As for representative rated values in a representative 16 K RAM or 64 K RAM of the RAS/CAS 2-clock operation type in the prior art, as compared to the conventional RAS/CAS cycle time of 270 NS which is represented by $T_{C1}$ in FIG. 2, the consecutive access time represented by $T_{C2}$ can be shortened to 70 NS, which is approximately 25% of the former time.

The operation and characteristics of the high speed read cycle in the consecutive access mode are as described above, and the writing cycle in that mode is as follows. For the writing operation during the normal RAS/CAS cycle ($T_{C1}$), two modes are known, which include a READ-MODIFY-WRITE cycle in which after memory cell information has been read, data is written, and an EARLY-WRITE cycle in which before memory cell information appears at a data output terminal, the output terminal is held at a high impedance condition as controlled by an internal signal activated by the $\overline{WE}$ clock. In the following description the latter mode will be employed because it is intended to refer to only the case of high speed writing. That is, in the "EARLY-WRITE cycle", when the $\overline{CAS}$ and $\overline{WE}$ clocks shift from the "1" level to the "0" level and thus assume activated conditions, in response to an activation clock that is generated immediately in synchronism with the $\overline{WE}$ clock, input information is taken in the data input buffer and amplified, and thereby a binary data code is produced. The clock taking charge of amplification of the input information by means of the data input buffer achieves the drive of a control signal for the transfer gate transistors which couple the binary data codes to the I/O bus pair, and thereby quickly effects writing of the input information in the memory cell. However, considering the time necessary for reading and writing, respectively, in this consecutive access mode, in reading what determines the access time is, as described previously, two clocks: the I/O bus selection drive clock and the output buffer activation clock which is preset so as to be produced in response to the former clock. Whereas, in a write cycle, first, input information to be written must be input to the data input buffer in response to a clock generated immediately after activation by the $\overline{CAS}$, and in response thereto it is necessary to amplify the information input to the input buffer, produce binary data codes and at the same time produce a drive signal for data transfer to the selected I/O bus pair. The increment of about 20 NS of the write cycle in the consecutive access mode, which is increased in view of the fact that an increase of about 20 NS is essentially necessary if consideration is made of the time necessitated for the potential rise of the memory cell which is caused via two transistors including the transistor for coupling the I/O bus line to the digit line and the transistor for coupling the digit line to the memory cell by the information transferred to the I/O bus pair, amounts to an increase of about 30% with respect to the read cycle time. Hence, the loss is extremely large.

Now, a preferred embodiment of the present invention will be described with reference to FIGS. 3 and 4.

Figure 3:
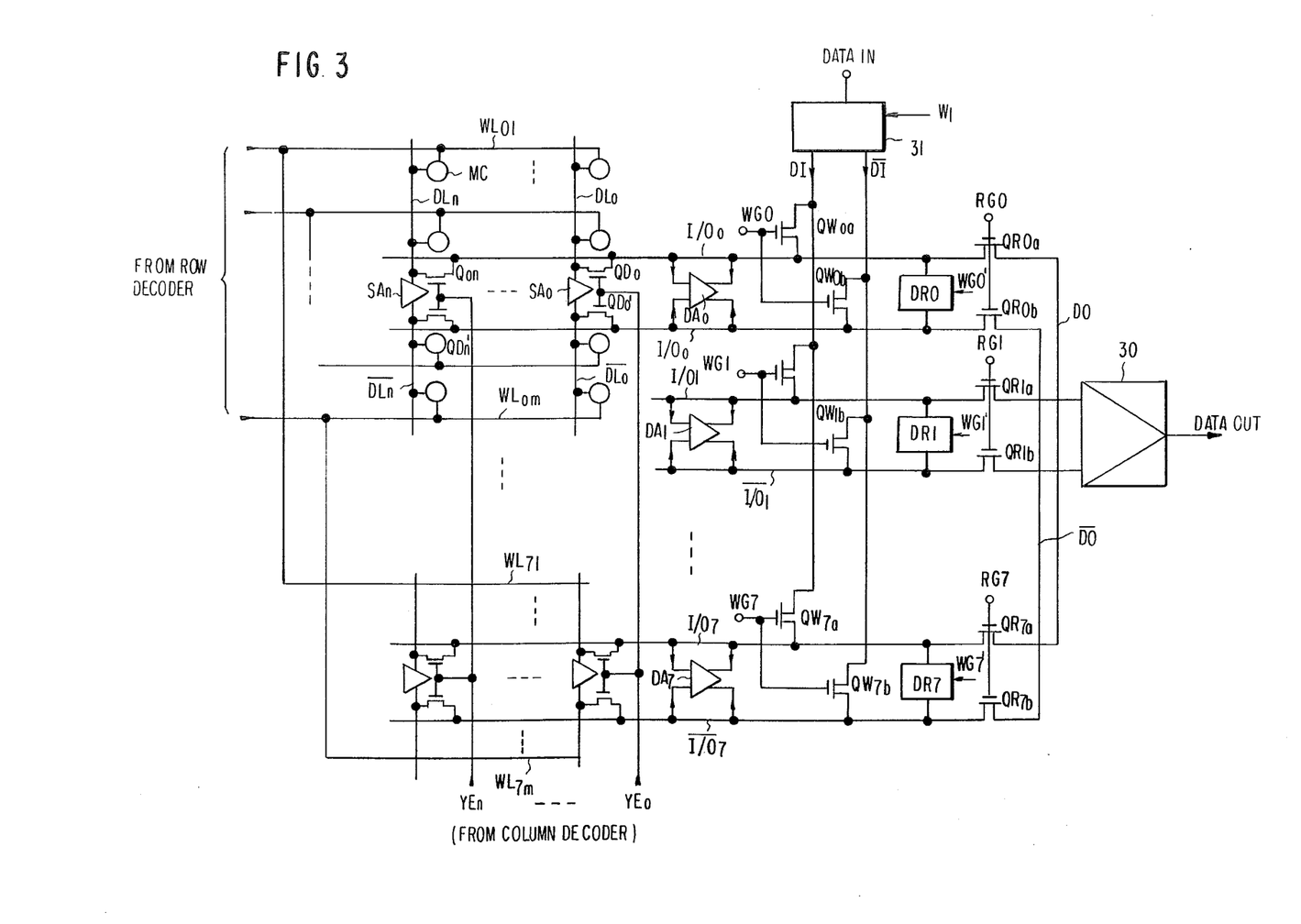
FIG. 3 is a diagram showing the basic construction of present invention.
Figure 4:
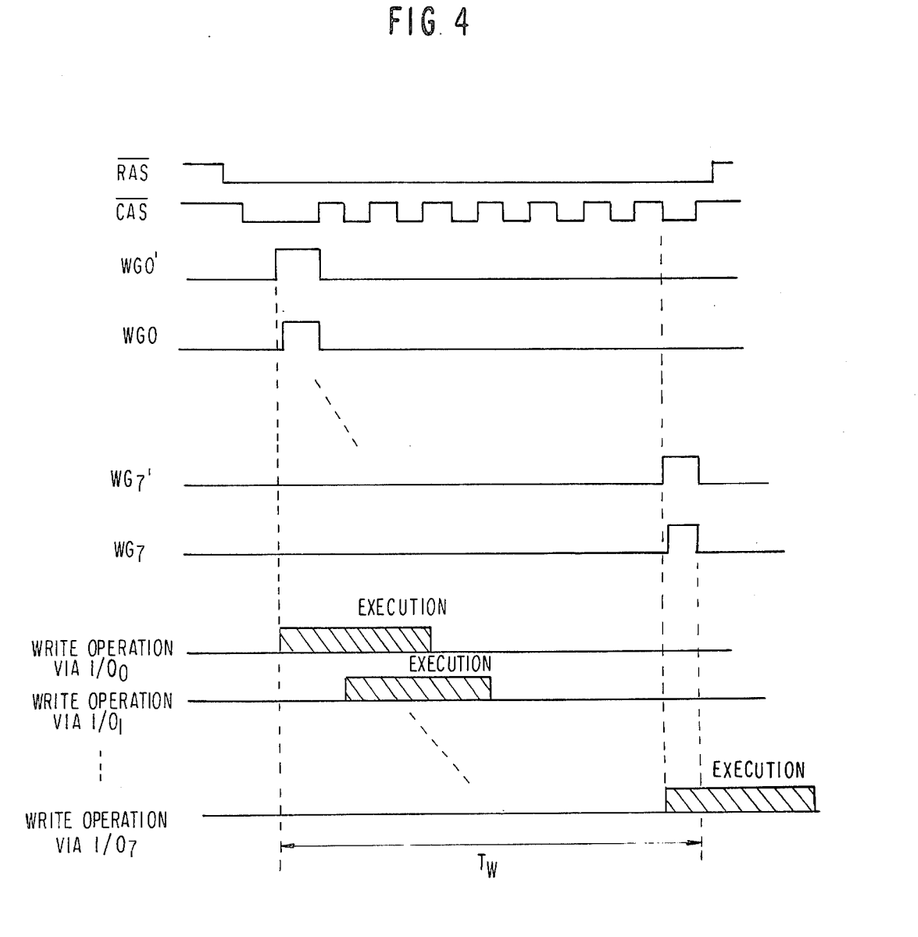
FIG. 4 is a timing diagram for use with FIG. 3.

In FIG. 3, eight pairs of I/O bus lines (I/O$_0$, $\overline{I/O_0}$) to (I/O$_7$, $\overline{I/O_7}$) are included. To the bus line pair (I/O$_0$, $\overline{I/O_0}$), a plural pairs of digit lines (DL$_0$, $\overline{DL_0}$) to (DL$_n$, $\overline{DL_n}$) are coupled through transfer gate pairs (QD$_0$, $\overline{QD_0}$) to (QD$_n$, $\overline{QD_n}$), respectively under the control of digit selection signals YE$_0$ to YE$_n$. Memory cells MC are arranged at the intersections of the digit lines and the word lines WL. Sense amplifiers SA$_0$ to SA$_n$ are provided for the digit line pairs (DL$_0$, $\overline{DL_0}$) to (DL$_n$, $\overline{DL_n}$), respectively in a known manner. To other bus line pairs (I/O$_1$, $\overline{I/O_1}$) to (I/O$_7$, $\overline{I/O_7}$), the same number of digit line pairs are coupled through the transfer gate pairs in the same way as with respect to the bus line pair (I/O$_0$, $\overline{I/O_0}$). In this arrangement, the digit selection signals YE$_0$ to YE$_n$ are commonly utilized for designating digit line pairs for respective bus line pairs. Data amplifiers DA$_0$ to DA$_7$ are provided for the bus line pairs (I/O$_0$, $\overline{I/O_0}$) to (I/O$_7$, $\overline{I/O_7}$), respectively and operatively amplify the signals at their associated bus line pairs. Further, according to the present invention, data registers DR$_0$ to DR$_7$ are provide for the bus line pairs (I/O$_0$, I/O$_0$) to (I/O$_7$, I/O$_7$) respectively. The data registers DR0 to DR$_7$ operatively hold the data on their associated bus line pairs, respectively. A pair of data input bus lines DI and $\overline{DI}$ are coupled to the bus lines of the bus line pairs (I/O$_0$, $\overline{I/O_0}$) to (I/O$_7$, $\overline{I/O_7}$) through plural pairs of transfer gate transistors (QW$_{0a}$, QW$_{0b}$) to (QW$_{7a}$, QW$_{7b}$), respectively. An output buffer 30 has a pair of input terminals coupled to the bus line pairs (I/O$_0$, $\overline{I/O_0}$) to (I/O$_7$, $\overline{I/O_7}$) through a pair of data lines D$_0$ and $\overline{D_0}$ and plural pairs of read gate transistors (QR$_{0a}$, QR$_{0b}$) to (QR$_{7a}$, QR$_{7b}$), respectively.

Let us now consider the cycles, in which the I/O bus pair (I/O$_0$, $\overline{I/O_0}$) is selected in the RAS/CAS cycle and in the subsequent consecutive access cycle the I/O buses (I/O$_1$, $\overline{I/O_1}$) to (I/O$_7$, $\overline{I/O_7}$) are sequentially selected. During the RAS/CAS cycle, if the write mode is selected in response to the activation of the $\overline{WE}$ clock, then a first write control signal is generated immediately as synchronized with the $\overline{WE}$ clock and input information is input to the data input buffer 31. In response to a second write control signal that is generated consecutively, amplified binary data codes are produced on the data bus lines (DI, $\overline{DI}$) and coupled to the I/O bus pair via transfer gate transistors (QW$_{0a}$, QW$_{0b}$) to (QW$_{7a}$, QW$_{7b}$) used solely for writing. The transfer gate transistors for write use only are provided for the respective I/O bus pairs, and are controlled by write gate control signals WGi (i=0~7) so as to feed the binary data codes received from the data input buffer 31 to the selected I/O bus pair. Simultaneously with the transfer of the binary data codes to the selected I/O bus pair, the data binary information is held in the data register DR$_0$. Then, the write operation into the memory cell associated with the I/O bus line pair (I/O$_0$, $\overline{I/O_0}$) is performed by use of the data held by the data register DR$_0$. Then, the cycle enters the consecutive access mode by repeating the activation and the reset states of the $\overline{CAS}$ signal while maintaining the $\overline{RAS}$ signal at its active (low) level. When the $\overline{RAS}$ signal changes from its inactive level (high level) to its active (low) level following the occurrence of the write gate control signal WG$_0$, the first write signal W$_1$ is produced so that new write data is set in the data buffer 31 and the set write data are transferred to the I/O bus line pair (I/O$_1$, $\overline{I/O_1}$) through the transfer gate transistors QW$_{1a}$ and QW$_{1b}$ in response to a write gate control signal WG1. The write data transferred to the bus line pair (I/O$_1$, $\overline{I/O_1}$) are then held by the data register DR$_1$. The write operation into the memory cell associated with the I/O bus line pair (I/O$_1$, $\overline{I/O_1}$) is maintained by the data held in the data register DR$_1$ after the signal WG$_1$ is switched to its inactive (low) level. In this write operation, the data held by the data register DR$_1$ are transferred to the digit line pair through the selected transfer gate transistors (QDi, $\overline{\text{QDi}}$). In this connection, the data amplifier DA1 and the sense amplifier are enabled to assure levels sufficient for the write operation.

Thus, the write data for the memory cells associated with the bus line pairs (I/O$_2$, $\overline{\text{I/O}_2}$) to (I/O$_7$, $\overline{\text{I/O}_7}$) are sequentially stored in the data registers DR2, to DR7 respectively, in response to the write gate control signals WG2 to WG7 in synchronism with the respective activation of the $\overline{\text{CAS}}$ signal. Thus, the respective write operations into the different memory cells can be performed in parallel by use of the stored write data. As viewed from the external, all the write operations can be equivalently observed as if completed in a period TW from the occurrence of the signal WG0 to the occurrence of the signal WG7.

Thus, the consecutive write operations can be performed at high speed.

In this embodiment, when the operation transferred to the consecutive access cycle, shifting of the decoder was sequentially efrected bit by bit, upon every shift the data binary information was stored in each data register and the above operation was completed within 8 bits, by merely elongating the activation time of the $\overline{\text{CAS}}$ signal by about 20 NS as compared to the preceding cycle when the consecutive access cycle terminated. It thus becomes possible to transmit the input information stored in the respective data registers as a whole to the respective I/O bus pairs simultaneously, as controlled by the third write control clock generated in synchronism with the $\overline{\text{WE}}$ clock, to thereby assume the write potential at the memory cell. Furthermore, an additional advantage is also produced in that since the respective data registers DR0 to DR7 are controlled by decoded control signals WG0' to WG7' from the decoder, and operate to achieve selective storage, it is also possible to realize a read/write mixed mode in the consecutive access cycle.

Figure 5:
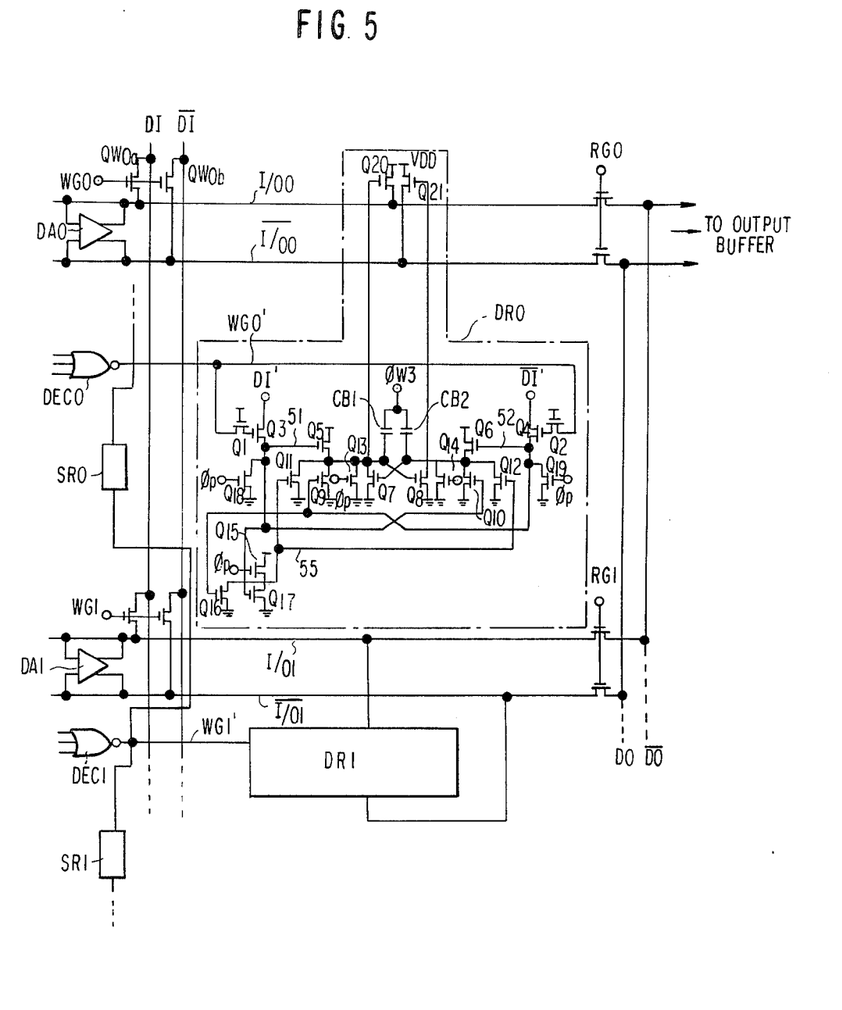
FIG. 5 is a diagram showing one preferred embodiment of the present invention.

Next, an explanation will be made relative to a detailed example of the structure related to the data registers with reference to FIG. 5. It is now assumed that the operation has been transferred to the consecutive access mode of a write cycle and the output WG0' of a decoder DEC$_0$ has been selected. In addition, in order to consider high speed writing, let us consider the operation in the "EARLY-WRITE mode".

As soon as the $\overline{\text{CAS}}$ clock comes in, a signal RG$_0$ rises in response to an I/O bus pair selection drive signal which also serves as a decoded information holding signal applied to shift registers SRi (i=0~7), and an I/O bus pair I/O$_0$, $\overline{\text{I/O}_0}$ is selected. In this instance, this I/O bus pair and a data output bus pair (DO, $\overline{\text{DO}}$) are coupled to each other. At this moment, the output buffer (30) to which the above-mentioned data output bus pair are connected is subjected to control by a plurality of write control signals produced in response to the $\overline{\text{WE}}$ clock, and is set to inhibit its activation operation, so that an output terminal is maintained in a high impedance state. In the so-called "EARLY-WRITE mode" in which the $\overline{\text{WE}}$ clock comes in almost simultaneously with the $\overline{\text{CAS}}$ clock, in response to these clocks a first write control signal is generated immediately, whereby input information is input to a data input buffer (not shown), the input information is amplified as controlled by a second write control signal which is subsequently generated, and binary data codes are produced on the lines DI and $\overline{\text{DI}}$. The data input buffer is set so as to simultaneously produce other binary data codes (DI', $\overline{\text{DI}'}$), as well.

The produced sets of binary data codes (DI, $\overline{\text{DI}}$) and (DI', $\overline{\text{DI}'}$) are preset to take the power supply level and the ground level, respectively, when the data input buffer is in an inactivated condition. Simultaneously with the production of the two sets of input binary data codes, a signal WG$_0$ rises in response to the state of the output mode NG0' of the selection decoder DEC$_0$ and as driven by a second write control signal. At this moment, since either one of the data binary codes DI and $\overline{\text{DI}}$ is at the power supply level, the signal WG$_0$ is set so as to be higher than the power supply level for the purpose of enhancing the information transmission capability to the selected I/O bus pair. Assuming now that the memory cell information is at the "0" level, and the write information is at the "1" level, then in the selected I/O bus pair the bus I/O$_0$ takes the "0" level while the bus $\overline{\text{I/O}_0}$ takes the "1" level, and the binary data code DI is at the "1" level while the binary data code $\overline{\text{DI}}$ is at the "0" level, so that in response to the rise of the signal WG$_0$, the levels of the selected I/O bus pair are subjected to changes such that the bus I/O$_0$ tends to transfer to the "1" level while the bus $\overline{\text{I/O}_0}$ tends to transfer to the "0" level. The time required for these changes is determined depending upon how quickly the transistors (not shown) forming an output stage of the data input buffer and a pair of write control transfer gate transistors QW$_{0a}$ and QW$_{0b}$ can charge or discharge the stray capacitance associated with the selected I/O bus pair I/O$_0$ and $\overline{\text{I/O}_0}$. Moreover, in response to the potential change on this I/O bus pair, charging is completed from the I/O bus pair to the selected digit line, and further from the selected digit line via the gate transistor of the cell of the memory storage node.

Next, a detailed explanation of the data register DR0 will be provided.

In the RAS/CAS cycle in which the $\overline{\text{RAS}}$ clock is activated and the $\overline{\text{CAS}}$ clock is subsequently activated, at first a precharge clock $\phi_p$ shifts from the internal MOS logic "1" level to the "0" level. Nodes 51~54 are reset to the ground potential by transistors Q$_{13}$, Q$_{14}$, Q$_{18}$ and Q$_{19}$ which are controlled by the clock $\phi_p$, and a node 55 is charged via a transistor Q$_{15}$ up to the V$_{DD}$-V$_T$ level. Here, V$_T$ is the threshold voltage of the transistors. In the write mode, the input information taken into the input data buffers as controlled by the second write control clock generated in response to the $\overline{\text{WE}}$ clock, is amplified, and if the input write information is assumed to be "1", the data binary code line $\overline{\text{DI}'}$ is maintained at the ground potential. Since the relation decoder DEC$_0$ has been already selected, in response to the state of the WG$_{01}$ signal, a transistor Q$_3$ is turned ON via a transistor Q$_1$ to follow the potential rise of the binary data code line DI', hence a potential rise is effected quickly, and a node 51 can rise up to the power supply level (V$_{DD}$) similarly to the binary data code line DI' owing to a boot-strap effect produced by the gate-source parasitic capacitance of the transistor Q$_3$. At this moment, since the binary data code line $\overline{\text{DI}'}$ is at the ground potential, a node 52 is maintained at the "0" level by a transistor Q$_4$ which has been turned ON. Furthermore, in response to the states of the nodes 51 and 52, a transistor Q$_5$ is turned ON while a transistor Q$_6$ is turned OFF. Thus, information storage nodes 53 and 54 are respectively driven to the logic "1" level which is equal to the (power supply voltage - threshold voltage) and the logic "0" level which is equal to the ground potential. At this moment the node 54 takes the so-called "0" floating potential because after resetting to the ground potential in response to the precharge clock $\phi_p$, the transistor $Q_6$ is also turned OFF, and there occurs a condition where the node 54 is liable to be influenced by an external noise or the like. Hence a contrivance is made such that a flip-flop consisting of transistors $Q_7$ and $Q_8$ is introduced, in which a transistor $Q_8$ may be turned ON in response to the "1" level at the node 53 and thereby the node 54 may be surely maintained at the ground potential. In the RAS/CAS cycle, since a sufficiently long activation time of the $\overline{CAS}$ signal can be obtained, the generation of a third write control signal $\phi_{W3}$ in response to the $\overline{WE}$ clock becomes possible, and in response to the rise of that clock, owing to the existence of capacitors $CB_1$ and $CB_2$, the potentials at the nodes 53 and 54 are boosted. At this moment, since the node 53 is at the "1" level, a further potential rise is effected, and in view of the fact that the potential before boosting is at least as high as the $V_{DD}$-$V_T$ level in the RAS/CAS cycle, the node 53 can be raised in potential higher than the power supply level by means of the capacitor $CB_1$ which is preset at an appropriate capacitance value. On the other hand, the node 54 is at the ground potential, and charging of a stray capacitance at the node 54 is effected through the capacitor $CB_2$ by the clock $\phi_{W3}$, hence a slight potential rise is observed, but due to the existence of the transistor $Q_8$, the electric charge is quickly discharged. Since the node 53 is boosted higher than the power supply level, whereby a transistor $Q_{20}$ is turned ON and thus the input information "1" is written in a memory cell, a novel function which was not present in the prior art can be provided in that only one I/O bus $I/O_0$ in the selected I/O bus pair has its potential rise accelerated by the clock $\phi_{W3}$ on the basis of the information stored in this data register.

The above-described basic operation is also applicable to a consecutive access cycle. In either cycle, the generation of a write control clock in response to the application of the $\overline{WE}$ clock is possible, and the only difference exists in whether the generation of the third write control clock $\phi_{W3}$ is present or not depending upon whether the activation time of the $\overline{CAS}$ signal is large or small. Temporary storage of the input information at the data storage nodes 53 and 54 is always effected, and in the activation time of the $\overline{CAS}$ signal of 30 NS, though a sufficiently high level cannot be written in the memory cell, the information storage in the data registers selected for the respective cycles is always possible. OR-coupled transistors $Q_{16}$ and $Q_{17}$ which are subjected to control by the nodes 52 and 51, respectively, form a NOR logic circuit jointly with a load transistor $Q_{15}$ which is subjected to control by the clock $\phi_p$, and a NOR output node 35 controls transistors $Q_{11}$ and $Q_{12}$ which reset the information storage nodes 53 and 54 to the ground potential. Thereby the node 55 is maintained at a high level until the data register is selected to operate, and measures are taken such that potential rise at the storage nodes 53 and 54 caused by generation of the clock $\phi_{W3}$ may be suppressed and erroneous writing to an unselected I/O bus pair and an I/O bus pair selected upon reading may be prevented by maintaining both the information storage nodes 53 and 54 at the ground potential. In addition, it is to be noted that the existence of this NOR logic circuit does not spoil the data holding function of the data register, because in the data register selected upon writing one of the nodes 51 and 52 rises in response to the data binary codes DI' and $\overline{DI'}$ and thus resets the node 55 to the ground potential.

In any event, even in the consecutive access cycle having an extremely short activation time of the $\overline{CAS}$ signal, the input information that has been decoded on the basis of the decoded information is surely latched in the data register by merely selecting the last cycle in the consecutive access cycle so as to be excessive by at least 20 NS, which is sufficient to generate the third write control clock which takes charge of the write level assuring function, the potentials at the corresponding I/O bus pairs can be simultaneously raised as a whole on the basis of the input information stored in the respective data registers. Accordingly, a remarkable advantage can be realized in that the read cycle time and the write cycle time in the consecutive access cycle can be equalized. Another surplus advantage can be obtained in that in the consecutive access cycle it is possible to mixedly provide read and write cycles.

I claim:

1. A memory circuit, comprising;
   (a) a data line;
   (b) a plurality of memory cell arrangements; each of said arrangements including:
      a group of memory cells,
      a bus line operatively coupled to said group of memory cells, a transfer gate having a first electrode coupled to said bus line and a second electrode coupled to said data line, and a latch circuit coupled to said bus line and operatively holding data to be written into the memory cell group; and
   (c) means for sequentially enabling the transfer gates of said arrangements to thereby supply each said latch circuit of each of said arrangements with write data; whereby write operations into the memory cell groups of said arrangements are carried out using data held by said latch circuits in the respective arrangements.

2. The circuit according to claim 1, in which each of said memory cell groups includes a plurality of word lines, a plurality of digit lines intersecting with said word lines and a plurality of transfer gates coupled between the respective digit lines and the associated one of said bus lines.

3. The circuit according to claim 1, further comprising means for receiving a row address strobe signal for incorporating row address information and means for receiving a column address strobe signal for incorporating column address information.

4. The circuit according to claim 3, in which said enabling means operates in response to the respective activation of said column strobe signal.

5. A memory circuit, comprising; a plurality of memory cells arranged in a matrix of rows and columns, a first number of bus lines, row means for selecting one of said rows, a first column decoder for selecting a first number of said columns to be connected to said first number of said bus lines, a data line, a plurality of switching means coupled between said data line and said bus lines, a second column decoder for selecting one of said switching means, and a plurality of data registers, each of said data registers being coupled to one of said bus lines and operatively storing data applied to that bus line through one of said plurality of switching means coupled to that bus line.

6. The circuit according to claim 5, further comprising a shift register coupled to said second column decoder for sequentialy enabling said switching means.

7. A memory device, comprising; a plurality of memory cell groups, each of said groups including a plurality of memory cells, a plurality of bus lines, each of said bus lines being coupled to one of said memory cell groups, a plurality of selection means, each of said selection means being coupled to one of said memory cell groups for selecting a memory cell to be electrically connected to the bus line coupled to the same memory cell group, a data line, means for supplying said data line with write data, a plurality of latch means, each of said latch means being coupled to one of said bus lines for holding the data supplied to said bus lines, a plurality of connecting means, each of said connecting means being coupled between one of said bus lines and said data line, and control means for controlling said connecting means, wherein said write data is provided to one of said bus lines through one of said connecting means and is held by one of said latch means, and wherein a writing operation into a given memory cell group coupled to a given bus line is conducted based on the data held by the latch means connected to that bus line.

8. The circuit according to claim 7, wherein said control means includes means for sequentially enabling said connecting means.

9. The circuit according to claim 8, further comprising an output amplifier and means for selectively connecting one of said bus lines to an input terminal of said output amplifier.

10. The circuit according to claim 7, wherein each of said connecting means includes a transfer gate coupled between one of said bus lines and said data line.

11. A memory device comprising row lines, column lines divided into a plurality of column groups, memory cells disposed at the intersections of said row lines and column lines, each of said memory cells including means responsive to the potential of an associated row line for transferring data between the memory cell and its associated column line, a plurality of sense amplifiers, each of said sense amplifiers being coupled to one of said column lines means for receiving a row address strobe signal for enabling the introduction of row address data, means for receiving a column address strobe signal for enabling the introduction of column address data, means responsive to said row address data for enabling one of said row lines, a plurality of bus lines, each of said bus lines being coupled to one of said column groups, a plurality of latch means, each of said latch means being coupled to one of said bus lines, or data line, means for supplying said data line with input data, a plurality of coupling means, each of said coupling means being coupled to one of said bus lines and to said data line and operatively applying the data on said data line to the bus line connected thereto, and control means for enabling said plurality of coupling means in sequence upon each reception of said column strobe signal during the period when said row address strobe signal is present.

\* \* \* \* \*

UNITED STATES PATENT AND TRADEMARK OFFICE
CERTIFICATE OF CORRECTION

PATENT NO. : 4,485,461
DATED : November 27, 1984
INVENTOR(S) : Satoru KOBAYASHI

It is certified that error appears in the above-identified patent and that said Letters Patent is hereby corrected as shown below:

Column 1, line 16, after "technique" insert --a--; capitalize the word --This--.

Column 2, line 31, delete "member" and insert --number--.

Column 3, line 42, change "part" to --parts--;
lines 55 and 56, change "have been already" to --have already been--.

Column 7, line 15, delete "from the external" and insert --externally,--.
line 23, delete "efrected" and insert --effected--.

Column 8, line 12, delete "either";
line 36, change "of" to --to--.

Column 10, line 9, after "register" insert --.--; change "by" to --By--.

Column 11, line 3, change "sequentialy" to --sequentially--.

Signed and Sealed this

Seventeenth Day of September 1985

[SEAL]

Attest:

DONALD J. QUIGG

Attesting Officer

Commissioner of Patents and
Trademarks—Designate